United States Patent
Mansour

(10) Patent No.: US 11,329,392 B2
(45) Date of Patent: May 10, 2022

(54) COMPACT MULTI SPOT BEAM COMMUNICATION SYSTEM FOR SMALL SATELLITE

(71) Applicant: NSL COMM LTD, Airport City (IL)

(72) Inventor: David Mansour, Tel Aviv (IL)

(73) Assignee: Nsl Comm Ltd., Airport City (IL)

( * ) Notice: Subject to any disclaimer, the term of this patent is extended or adjusted under 35 U.S.C. 154(b) by 0 days.

(21) Appl. No.: 17/146,275

(22) Filed: Jan. 11, 2021

(65) Prior Publication Data

US 2021/0218150 A1 Jul. 15, 2021

Related U.S. Application Data

(60) Provisional application No. 62/958,768, filed on Jan. 9, 2020.

(51) Int. Cl.
| | | |
|---|---|---|
| *H01Q 1/28* | (2006.01) | |
| *H04B 1/40* | (2015.01) | |
| *H03F 3/19* | (2006.01) | |
| *H01Q 3/26* | (2006.01) | |
| *H01Q 19/195* | (2006.01) | |
| *H04B 7/185* | (2006.01) | |
| *H01Q 21/06* | (2006.01) | |

(52) U.S. Cl.
CPC .......... *H01Q 19/195* (2013.01); *H01Q 1/288* (2013.01); *H01Q 21/065* (2013.01); *H03F 3/19* (2013.01); *H04B 1/40* (2013.01); *H04B 7/18515* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 5,162,809 A | 11/1992 | Wu | |
| 5,557,292 A | 9/1996 | Nyrgen et al. | |
| 5,959,594 A | 9/1999 | Wu et al. | |
| 10,116,051 B2 * | 10/2018 | Scarborough | H01Q 21/22 |
| 10,637,152 B2 * | 4/2020 | Legay | H01Q 1/48 |
| 10,892,553 B2 * | 1/2021 | Sazegar | H01Q 5/42 |
| 2011/0210903 A1 | 9/2011 | Sarabaudi et al. | |
| 2015/0236416 A1 | 8/2015 | Fonseca | |
| 2021/0344375 A1 * | 11/2021 | Turkowski | H04B 7/18528 |
| 2022/0006511 A1 * | 1/2022 | Esfahlani | H04B 7/18513 |

OTHER PUBLICATIONS

Search Report for Application No. PCT/IL2021/050030, dated Mar. 25, 2021.

* cited by examiner

*Primary Examiner* — Pablo N Tran
(74) *Attorney, Agent, or Firm* — Pearl Cohen Zedek Latzer Baratz LLP

(57) ABSTRACT

A multi-beam transmit/receive device comprises a Circular Polarization Frequency Selective Surface (CPFSS) unit, a transmit (Tx) flat array antenna assembly with multi-bean flat array antenna and a receive (Rx) flat array antenna assembly with multi-bean flat array antenna. The Tx multi-beam antenna is poisoned with respect to the CPFSS unit so that its transmission is configured to be reflected by the CPFSS unit to a reflector and to be reflected by the reflector in a defined direction and the Rx multi-beam antenna is poisoned with respect to the CPFSS unit so that transmission that hits the reflector from the defined direction and passes through the CPFSS unit focuses on the Rx multi-beam antenna.

10 Claims, 15 Drawing Sheets

COMPACT MULTI SPOT BEAM COMMUNICATION SYSTEM FOR SMALL SATELLITE

CROSS-REFERENCE TO RELATED APPLICATION

This application claims the benefit of U.S. Provisional Patent Application No. 62/958,768, filed Jan. 9, 2020, the entire contents of which is incorporated by reference.

BACKGROUND OF THE INVENTION

In the last decade, three parallel efforts were made to increase capacity and transmission coverage area in the satellite communication industry. The Geostationary effort, like the VIASAT 3 from Viasat Inc., achieved both goals but at a really outrageous cost. A second effort is made, for example, by OneWeb Satellites Ltd., for example with Medium Earth Orbit (MEO) but end up again with a relatively large-size and costly satellite. Finally, a third effort is the Leo effort, where Starlink as the main example, employing thousands of satellites with still more than 200 Kg each which needs tens of billions of dollars to deploy and later on for maintenance.

There is a need for low weight, low volume, low energy and low-cost satellite communication system that covers a defined foot-print area on the earth.

SUMMARY OF THE INVENTION

Circular Polarization Frequency Selective Surface (CPFSS) unit is presented, the CPFSS comprising a plurality of CPFSS basic elements arranged in a planar arrangement of rows and columns Each of the basic elements comprises a rectangular substrate that may be made of a dielectric material. The substrate may comprise a first symmetric line parallel to a first side of the substrate and a second symmetric line parallel to a second side of the substrate, wherein the first and second symmetric lines are orthogonal to each other. The CPFSS may further comprise a first set of rectangular frames disposed on a first side of the substrate and a second set of rectangular frames disposed on a second side of the substrate, wherein at least one frame of the first set of rectangular frames and at least one frame of the second set of rectangular frames are disposed one within the other, both frames of each of the sets of frames are disposed symmetrically with respect to the first and the second symmetric lines, and the frames of the first set and the frames of the second set are made of conductive thin material.

In some embodiments, the substrate is a PCB substrate, and the first and second sets of frames are disposed on the first and second sides of the substrate, respectively, by a PCB production process.

A multi-beam transmit/receive device is disclosed comprising a Circular Polarization Frequency Selective Surface (CPFSS) unit, at least one transmit (Tx) flat array antenna assembly comprising multi-bean flat array antenna and at least one receive (Rx) flat array antenna assembly comprising multi-bean flat array antenna. The Tx multi-beam antenna may be positioned with respect to the CPFSS unit so that its transmission is configured to be reflected by the CPFSS unit to a reflector and to be reflected by the reflector in a defined direction, and the Rx multi-beam antenna may be positioned with respect to the CPFSS unit so that a transmission that hits the reflector from the defined direction and passes through the CPFSS unit focuses on the Rx multi-beam antenna.

In some embodiments, the multi-beam transmit/receive device further comprises a Tx multi beam amplifier (MBA) adapted to feed the Tx multi-bean flat array antenna with RF signals and a Rx multi beam amplifier (MBA) adapted to amplify RF signals received by the Rx multi-bean flat array antenna.

In some embodiments, each of the Tx multi-bean flat array antenna and the Rx multi-bean flat array antenna comprises a plurality of circular arrays of subnetworks, each forming an antenna beam, wherein each of the subnetworks comprises a central antenna element and six antenna elements evenly spaced and disposed around the central element in a uniform distance from the central element. The plurality of circular arrays of subnetworks are arranged in a hexagonal arrangement in which every two neighboring subnetworks share one antenna element with one another.

In some embodiments, each of the basic antenna elements may be excited by a single frequency and single polarization, or by a single frequency and two polarizations, or by two frequencies and a single polarization, or by two frequencies and two polarizations.

In some embodiments, the Tx flat array antenna assembly further comprises a Tx multi beam amplifier (MBA) unit, and the Rx flat array antenna assembly further comprises a Rx multi beam amplifier (MBA) unit.

In some embodiments, the Tx MBA unit comprises, for each beam of the Tx multi-beam antenna, an intermediate frequency (IF) amplifier, a solid-state power amplifier (S SPA) and one-to many switch unit adapted to direct signal provided to it to a selected beam element of the multiple beam elements of the beams. The Rx MBA unit comprises, for each beam of the Rx multi-beam antenna, an intermediate frequency (IF) amplifier, a solid-state power amplifier (SSPA) and one-to many switch unit adapted to direct signal received by a selected beam element of the multiple beam elements of the beams to the SSPA.

In some embodiments, the CPFSS unit, the at least one Tx flat array antenna assembly and the at least one Rx flat array antenna assembly are tiltable between a stowed position and a deployed position.

In some embodiments, in the deployed position, the CPFSS unit, the at least one Tx flat array antenna assembly and the at least one Rx flat array antenna assembly are positioned with respect to each other so that the transmission of the Tx flat array antenna assembly configured to be reflected by the CPFSS unit to a reflector and to be reflected by the reflector in a defined direction and transmission that hits the reflector from the defined direction and passes through the CPFSS unit focuses on the Rx multi-beam antenna.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
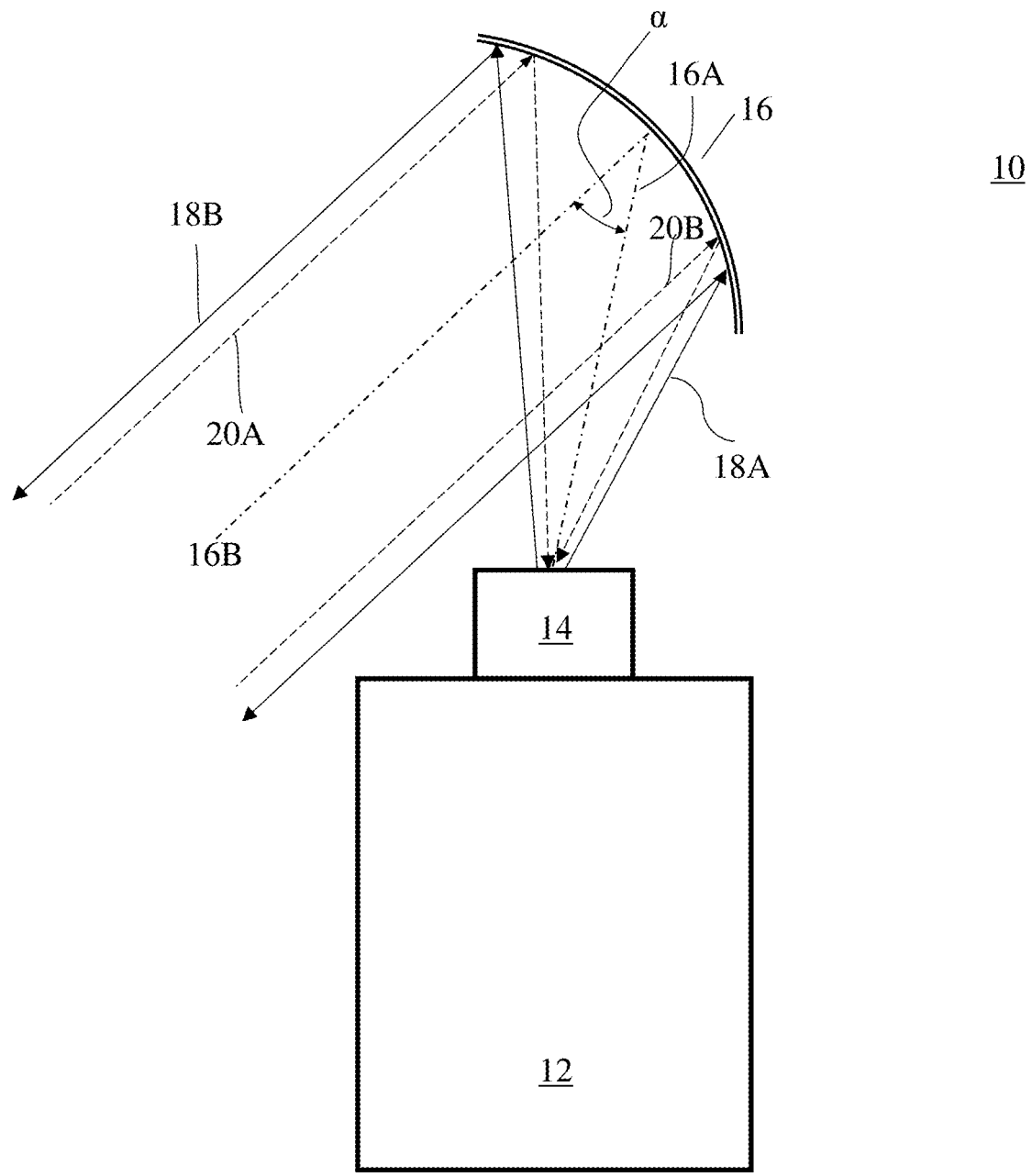
FIG. 1 is a schematic block diagram of a deployed satellite system built and operative according to some embodiments of the present invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Embodiments of the current invention provide a very low weight, low volume, low energy and low-cost solution for satellite communication system without affecting the required high-level performances. Some embodiments of the invention comprise the following separate components: 1) a deployable antenna; 2) a Circular Polarization Frequency Selective Surface (CPFSS) unit implemented on standard printed circuit, as differ for example from some known solutions, and 3) a multi feed per beam printed (MFPB) circuit unit based on patch elements with some sharing elements by adjacent elements, as described in detail herein below. The CPFSS unit and the MFpB circuit may be implemented on a standard printed circuit using a simple production process, which makes these units significantly simpler, cheaper and having lower volume than other similar solutions, such as the solution proposed in the Monitoring built-Up area from Satellite (MUSA) project where the similar beam sharing idea is based on a cumbersome horn technology with a polarizer and duplexer for each element.

In one embodiment, the satellite communication capacity may be increased by one to two orders of magnitude with only doubling the size and weight (e.g., occupying 12 Cubesat units, approximately 25 Kg). To achieve this goal, the size of every element of a satellite communication unit, according to the embodiment, has to be reduced. An antenna that may be used may be a known deployable antenna that needs only one CubeSat volume for launching. One aspect of a solution according to some embodiments of the invention is using the same antenna for both transmit and receive, thereby saving the volume and weight required for launching two antennas. This may be achieved by using a Frequency Selective Surface (FSS) device that may be implemented, according to one embodiment, on a single standard printed circuit, using simple and repeatable production process with high performance and easily reduced mass. Another aspect of the solution is implementing a multi feed beam array using a patch element that, together with a CPFSS unit, may be implemented using printed circuit technology. This may be achieved by using a special configuration of beam overlap that uses both right and left circular polarization simultaneously from each radiating element.

An advantage of a Leo satellite is the relatively lower required power of the solid state power amplifier (SSPA) because of the shorter distance from the satellite to a user. According to some embodiments of the invention, advantages of a monolithic microwave integrated circuit (MMIC) technology may be relied upon to offer a very small/low form factor microwave unit. An architecture according to some embodiments of the invention can provide transmission rate in the order of magnitude of Gbit/sec per one beam. A multibeam system having, for example, a 60 cm reflector can provide 100 beams of 1 Gbits/sec each, or a combined 100 Gbits/sec transmission rate. This presents the high-end of this technology using a single RF chain (low-noise-amplifier (LNA), power amplifier (PA) and intermediate frequency (IF) up/down converter) per beam. With multiple one-to-four switches or one-to-seven switches, the number of required RF Chains can be reduced by the same factor (i.e., reduced by four (4) or by seven (7), respectively). Accordingly, a system according to some embodiments of the invention can be optimized in size, weight and power consumption. Certain inventive aspects that enable this inventive system are described herein.

providing high communication capacity at low cost
disclosing low-cost and repeatable process for manufacture of Frequency Selective Surface unit with high performance (e.g., wide band with low losses)
Using:
multi feed based overlap beam implantation, and
patch element beam overlap
using advanced MMIC technology at Ka band range, especially in the implementation of SSPA technology Some embodiments of the invention may use both new architecture and new technology to provide a doubled order of magnitude of increase in capacity and one order of magnitude decrease in weight and form factor. This achievement is mainly due to the development of two different units: (1) a Circular Polarization (CP) Frequency Selective Surface (FSS) (also referred to herein CPFSS) unit operative in the Ka wavelength range that may be implemented on a standard printed circuit board manufactured in any suitable known technique, (2) a multi beam feed unit, which may be implemented on standard printed circuit board by known printed circuit technologies, and a new implementation of an overlap beam, to achieve a contiguous coverage with a single reflector.

Aspects of the invention relate to a very compact communication system that may be based on a number of new technologies. The communication system may use a single antenna reflector for both transmit and receive frequencies. In order to reduce the antenna feed size, a single circular polarization frequency selective surface (CPFSS) is proposed that may be used as a duplexer instead a employing a duplexer for every spot beam. The proposed CPFSS may be implemented on a printed circuit with high electrical performance (e.g., low loss factor and low axial ratio) and low cost.

Reference is made now to FIG. 1, which is a schematic block diagram of a deployed satellite system 10, built and operative according to some embodiments of the present invention. Satellite system 10 may comprise a satellite platform 12 carrying a satellite communication system 14 and a satellite reflector/antenna 16. Satellite communication system 14 is designed according to some embodiments of the invention, and is configured to use a single reflector for receiving multi beams and for transmitting multi beams, as is explained in detail hereinbelow. Communication system 14 is adapted to transmit RF signals, as depicted by the full line arrows 18A and 18B and to receive RF signals as depicted by dashed line arrows 20A and 20B. The transmission and receipt use the single reflector 16. The angle α between line 16A, which is the central imaginary line of the transmit/receive beams between communication system 16 and reflector 16m, and line 16B, which the imaginary central line aligned with the transmit direction between reflector 16 and a remote footprint of the transmit beam, is also referred to as the offset angle of communication system 14.

Figure 2A:
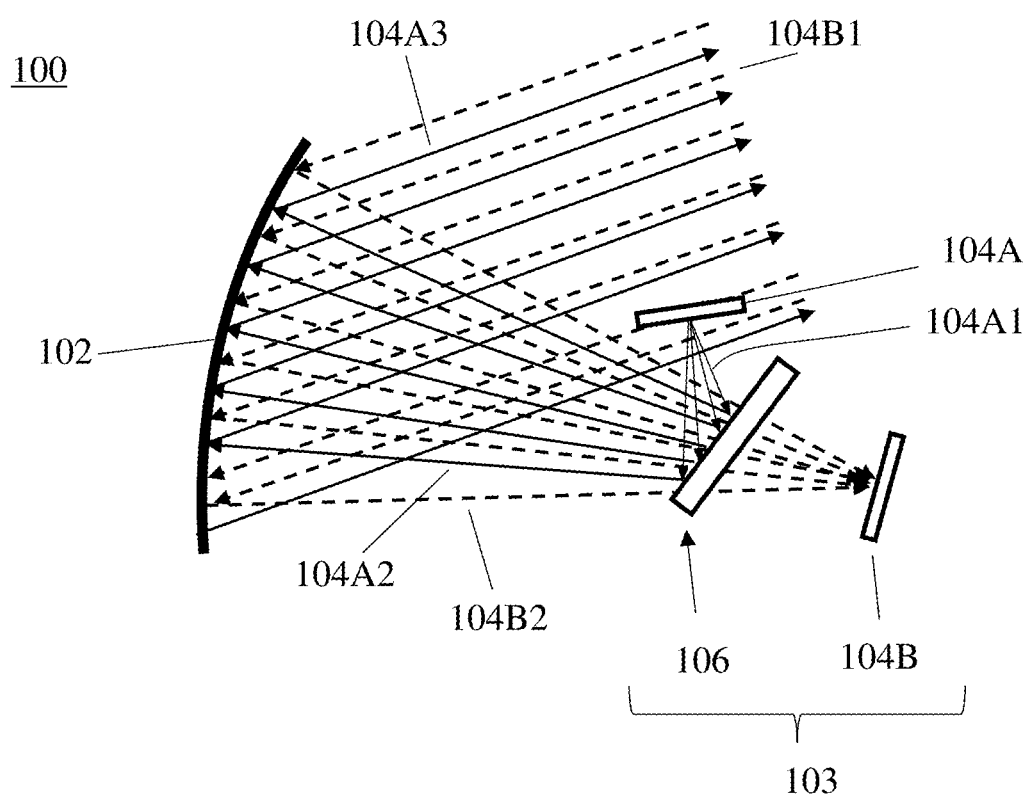
FIG. 2A is a schematic block diagram of a satellite multi beam communication system, according to some embodiments of the present invention.

Reference is made now to FIG. 2A, which is a schematic block diagram of a satellite multi beam communication system 100, according to some embodiments of the present invention. Satellite communication system 100 may be similar to communication system 14 of FIG. 1. System 100 may include one reflector 102, one or multiple feeds (e.g., patch array feeds, horn feeds, etc.) 104A, 104B, a Circular Polarization Frequency Selective Surface (CPFSS) unit 106 and a RF duplexer (not shown) for each of the multi feed elements, in which the LNA and RF front end units are in the receive path ant RF transmit path one or multiple units. According to some embodiments of the invention, the CPFSS unit 106 is adapted to reflect transmitted RF signals from transmit (Tx) multi beam unit 104A towards reflector 102 with negligible loses and high efficiency and to allow received RF signals arriving from reflector 102 to pass through it towards receive (Rx) multi beam unit 104B with negligible loses and high efficiency. Thereby, CPFSS unit 106 enables dual use reflector 102 and save the need to use separate reflectors for transmit and receive. In FIG. 2A, received RF signals impinging reflector 102 are depicted by dashed arrow lines 104B1, and received RF signals coming from reflector 102 towards Rx multi beam unit 104B are depicted by dashed arrow lines 104B2. RF transmitted signals from Tx multi beam unit are depicted by full arrow lines 104A1, RF signals reflected from CPFSS unit 106 toward reflector 102 are depicted by full arrow lines 104A2, and RF signals reflected from reflector 102 toward remote user are depicted by full arrow line 104A3.

Figure 2B:
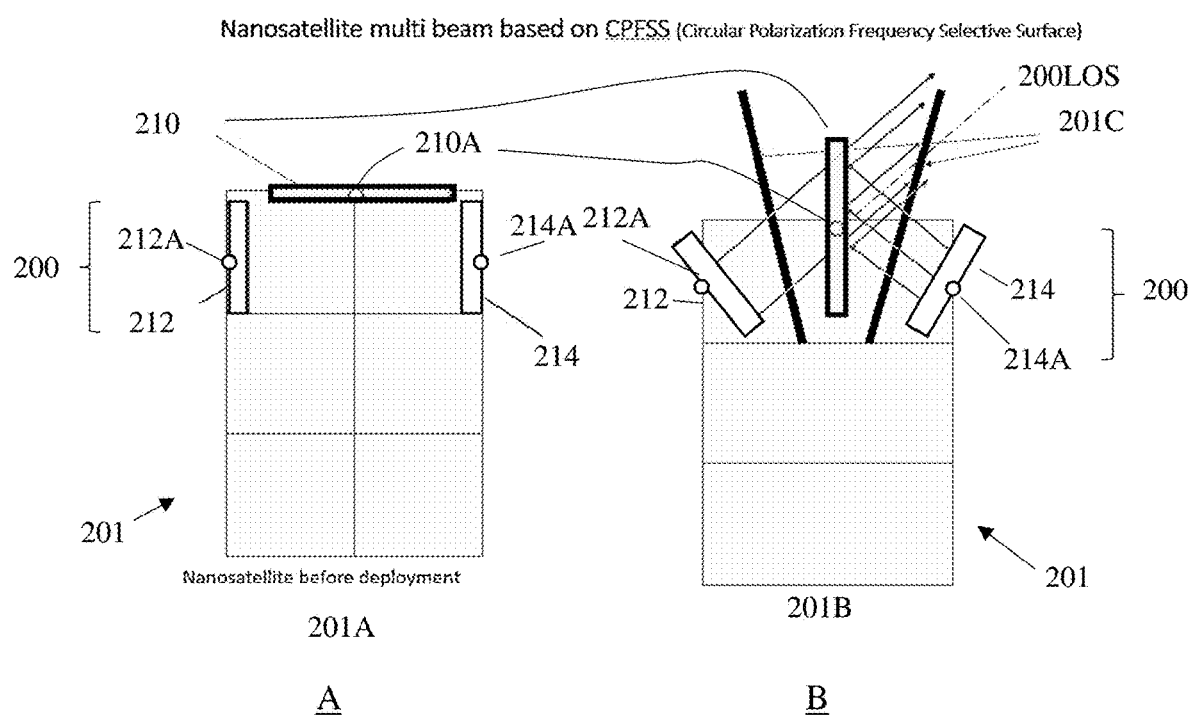
FIG. 2B is a schematic illustration of a multi beam transmit/receive device according to some embodiments of the invention.

Reference is made now to FIG. 2B, which is a schematic illustration of a multi beam transmit/receive device 200, according to some embodiments of the invention. Multi beam transmit/receive device 200 comprises a circular polarization frequency selective surface (CPFSS) unit 210, at least one transmit (Tx) multi-beam flat array antenna 212 and at least one receive (Rx) multi-beam flat array antenna 214. Device 200 may be carried by a nanosatellite 201. Multi beam transmit/receive device 200 is shown in a stowed position in drawing A and in a deployed position in drawing B. Flat array antenna assemblies 212 and 214 that may rotate about stow/deploy pivots 212A and 214A, respectively. CPFSS unit 210 may rotate about stow/deploy pivot 210A. In its stowed position, as depicted in drawing A, device 200 may have flat array antenna assemblies 212 and 214 held in their stowed position, for example positioned flat (e.g., parallel to) and adjacent to a close wall of nanosatellite 201, and CPFSS unit 210 may be held in its stowed position parallel and close to front top of nanosatellite 201. When required, e.g., when nanosatellite 201 is positioned in its operational position (e.g., LAO), as depicted in drawing B, flat array antenna assemblies 212 and 214 and CPFSS unit 210 may be rotated (or may otherwise change their orientation with respect to nanosatellite 201) to their respective deployed operational positions, as shown in drawing B of FIG. 2. According to some embodiments of the invention, flat array antenna assemblies 212 and 214 and CPFSS unit 210 may be implemented on printed circuit boards, thus having width in the order of few millimeters. The length and width of flat array antenna assemblies 212 and 214 and CPFSS unit 210 may be dictated by the specific intended use and typically may be in the order of 10-20 cm. This embodiment may significantly reduce the form factor and weight required for of multiple beam feeds (both of the Tx multi-beam flat array antenna assembly 212 and Rx multi-beam flat array antenna assembly 214). The RF circuit board of CPFSS unit 210 may be designed and configured to reflect the lower frequency band transmission (e.g., received by flat array antenna 214) while transmitting the higher frequency band through it (e.g., as transmitted by flat array antenna 212). Flat array antenna assemblies 212 and 214 may be positioned tilted, for example, in 45 degrees with respect to plane of the RF circuit board of CPFSS unit 210, thus both signals, Tx and Rx, approach the reflector (not shown) at the same direction, as demonstrated in FIG. 2B by line 200 LOS. In some embodiments, CPFSS 210 may mechanically be supported by one or more supporting struts 201C. Flat array antenna assemblies 212 and 214 may each comprise, in some embodiments, flat multi-beam array antennas and multi beam amplifiers, as described in detail hereinbelow.

Figure 3:
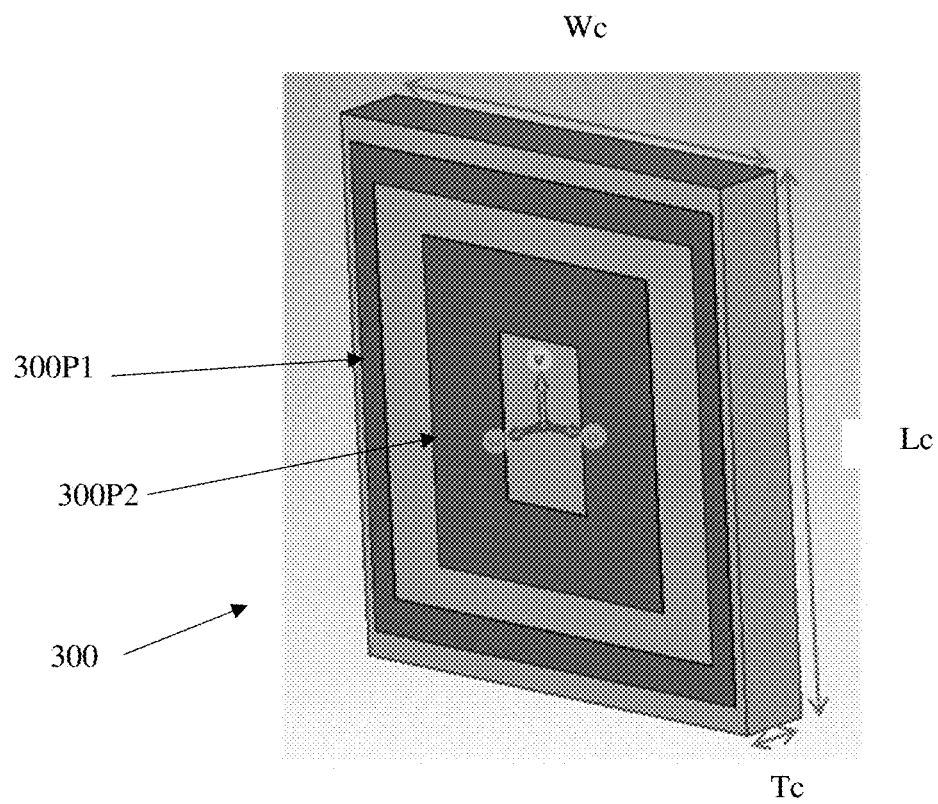
FIG. 3 is a schematic illustration of a single cell on a CPFSS array, according to some embodiments of the invention.
Figure 4:
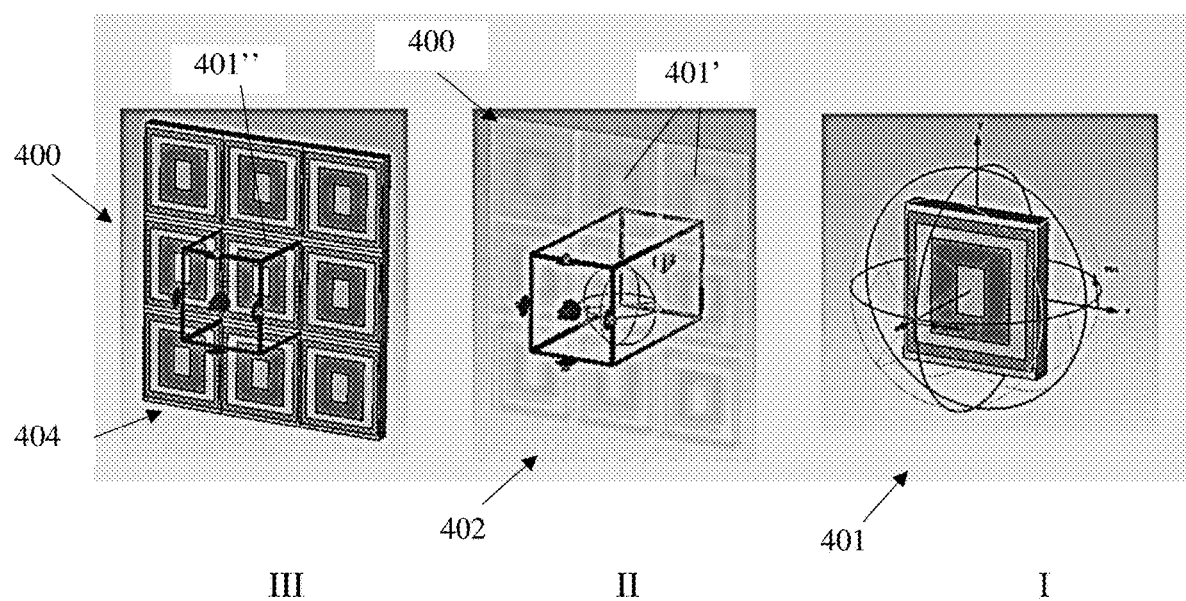
FIG. 4 is a schematic illustration of the single cell of FIG. 3 (I), an illustration of the electrical field developing at a junction created by 4 adjacent cells (II) and an illustration of the electrical field developing at a single cell in the array (III), according to some embodiments of the invention.

Reference is made to FIGS. 3 and 4, which depict an embodiment of a single cell 300 usable in a multi-cell CPFSS unit, and of an array 400 of cells of CPFSS, respectively, according to some embodiments of the invention. It will be noted that the physical dimensions associated with the single cell 300 of FIG. 3 are for demonstration only and that other dimensions may fit same or different specific details of a specific implementation. FIG. 3 is a schematic illustration of a single cell 300 comprised on a CPFSS array (such array 400 of FIG. 4), according to some embodiments of the invention. CPFSS cell 300 may be made as a printed circuit board known in the art on a dielectric board known in the art having, for example, dielectric coefficient εr=2.2 (e.g., as provided in Rogers 5880 type by Rayming Ltd.) with loss tangent=0.0009, thickness (Tc)=10 mil', and the print is by copper 0.5 oz/0.5 oz. Exemplary dimensions of the first printed element 300P1 and the second printed element 300P2 and their relative topologies, according to some embodiments, are described hereon below. The dimensions, materials and topology of CPFSS cell 300 enable it to operate as described above when arranged in an array, such as array 400 of FIG. 4, that is configured to enable RF transmission approaching CPFSS array (such as CPFSS unit 210 of FIG. 2B) from a reflector (such as reflector 102 of FIG. 2A) to pass through CPFSS with negligible losses and to reflect RF transmission coming to a CPFSS array (such as CPFSS unit 210 of FIG. 2B) from a multi beam flat array antenna towards a reflector (such as CPFSS unit 210 of FIG. 2B).

CPFSS cell 300 presents an optimized design of a basic element, where the size (length Lc, width Wc and depth Tc) and materials may be selected to optimize the transmission and reflection losses as well as the axial ration. In one embodiment, Wc=3.3 mm, Lc=3.58 mm and Tc=0.254 mm (10 mil').

This basic element 300 may be duplicated in two Cartesian dimensions to form a plane (or array) of N×M cells (3×3 in the example of FIG. 4 (III)). FIG. 4 depicts a schematic illustration of a single cell 401, such as cell 300 of FIG. 3 (drawing I), an illustration of the electrical field ε(combined) 402 developing at a junction created by four adjacent cells 401' (drawing II) and an illustration of the electrical field ε(single) 404 developing at a single cell 401" in the array 400 (drawing III). The same basic element may be duplicated, e.g., to 3×3 (only, for clarification) to create a CPFSS array, according to some embodiments of the invention.

Figure 3A:
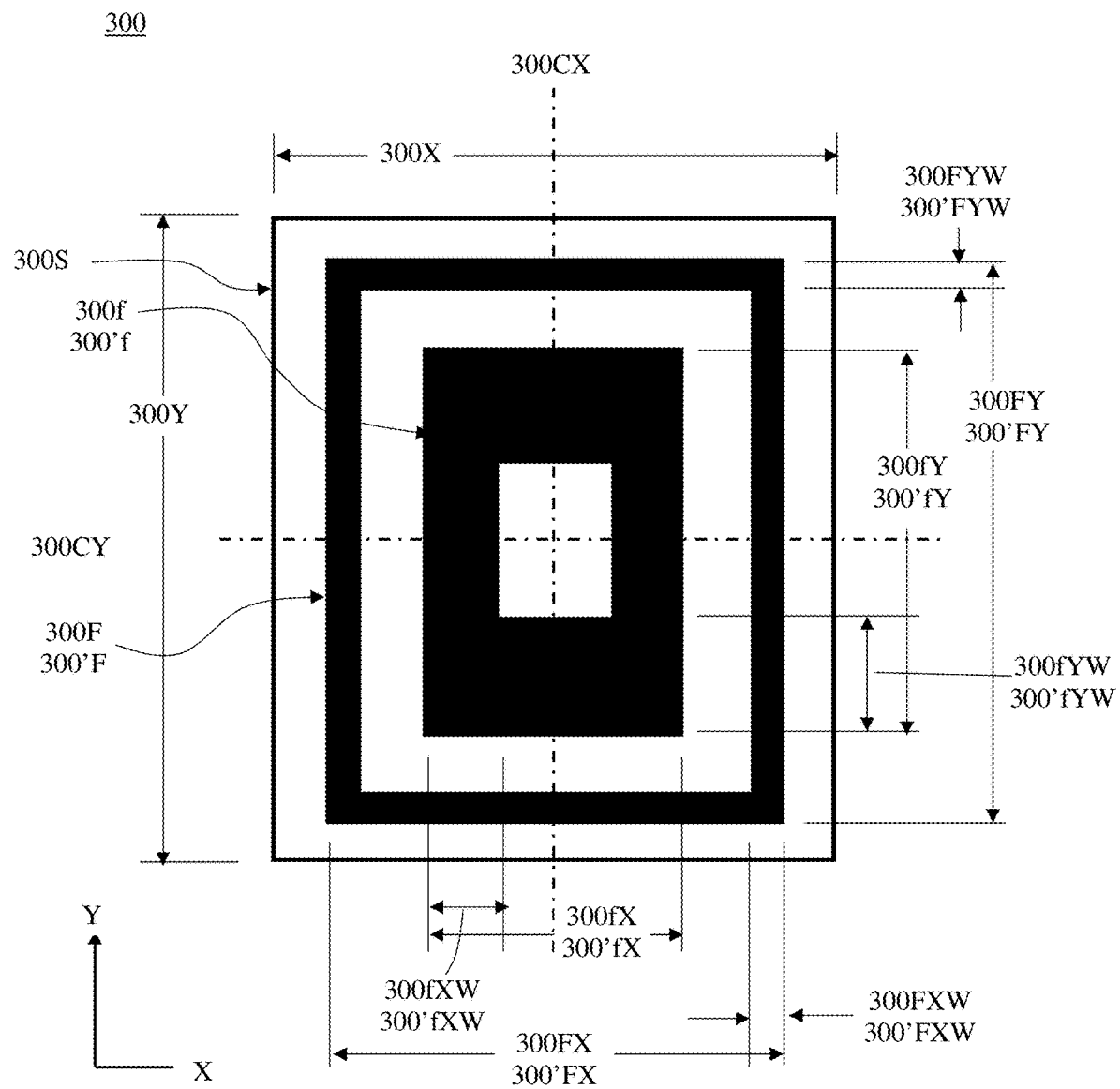
FIG. 3A is a schematic illustration of basic element of CPFSS depicting exemplary dimensions of the element, according to some embodiments of the invention.

Reference is made now to FIG. 3A, which is a schematic illustration of basic element 300 depicting exemplary dimensions of the element, according to some embodiments of the invention. Basic element 300, in some embodiments, may comprise two rectangular frames 300F (the external frame) and 300f (the internal frame) disposed on one face of a dielectric substrate 300S (e.g., a dielectric substrate used in the production PCBs) and two additional rectangular frames 300'F, 300'f disposed on the other face of the substrate. Rectangular frames 300F, 300f, 300'F and 300'f may be made of a conductive layer such as metallic layer (e.g., copper) that may be printed or otherwise disposed on substrate 300S. In some embodiments, frames 300F and 300f may have similar shape (e.g., rectangular frames, one within the other) but may have different dimensions. In some embodiments, the topology of frames 300F and 300f may be identical for both faces of the substrate. In some embodiments, frames 300F and 300f are disposed symmetrically with respect to symmetric lines 300CX and 300CY of substrate 300S. The notation of the dimensions that are depicted herein refer to the local reference frame X-Y. The dimensions of each of the two faces of basic element 300 may be expressed by the X and Y lengths of the frames and their widths. For an embodiment where frames 300F and 300f are disposed symmetrically on one face of substrate 300S and frames 300'F and 300'f are disposed symmetrically on the other face of substrate 300S, both with respect to symmetric lines 300CX and 300CY, the dimensions may be expressed by the X and Y lengths of each frame, and the X and Y widths may represent the physical dimensions of some embodiments of basic cell 300. The numbers in the table relate to the wavelengths of transmission that is designed to pass through basic element 300 (as described herein) and are expressed by "wavelength units. Wavelength of transmission that is designed to be reflected by basic element 300 may be in the range 150%+/−10% longer than that of the transmission designed to pass through basic element 300.

TABLE 1

| length (mm) | 300X | 300Y | 300FX | 300FXW | 300FY | 300FYW |
|---|---|---|---|---|---|---|
| 1st side | 3.55 ± 1.5% | 3.64 ± 1.5% | 3.28 ± 1.5% | 0.19 ± 1.5% | 3.37 ± 1.5% | 0.24 ± 1.5% |
| | | | 300fX | 300fXW | 300fY | 300fYW |
| 2nd side | | | 2.09 ± 1.5% | 0.67 ± 1.5% | 2.22 ± 1.5% | 0.54 ± 1.5% |
| | | | 300'FX | 300'FXW | 300'FY | 300'FYW |
| | | | 3.22 | 0.23 | 3.35 | 0.24 |
| | | | 300'fX | 300'fXW | 300'fY | 300'fYW |
| | | | 1.95 | 0.56 | 1.83 | 0.31 |

Figure 5:
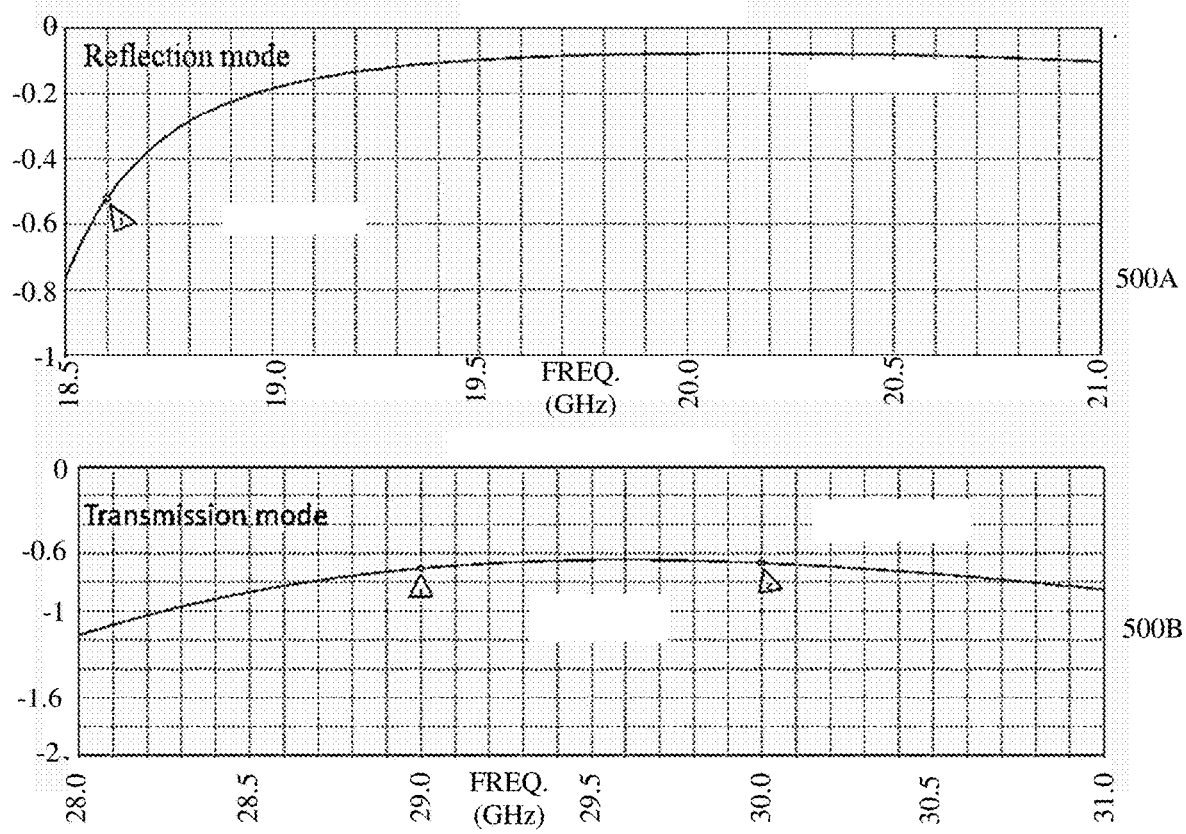
FIG. 5 is a graph showing the losses of the reflected signal (I) and the transmitted signal (II) where a CPFSS of FIG. 3 is used, according to some embodiments of the invention.

Reference is made to FIG. 5, which is a graph 500 showing the losses of the reflected signal (500A) as a function the frequency and the losses of the transmitted signal (500B) as a function the frequency when using a CPFSS unit such as CPFSS 210 of FIG. 2B, according to some embodiments of the invention. As seen in graph 500A, the performance of the RF reflected path in the range 10.6 GHz to 21 GHz is mostly flat at −0.1 db and drops a bit to −0.5 db close to the lower portion of the range. As seen in graph 500B, the performance of the RF transmitted path in the range between 28 Ghz and 31 GHz is substantially flat between 29 GHz and 30 GHz at −0.6 db and drops a bit closer to the lower and upper ends towards −1.2 db. Both graphs represent high performance both in the transmit and receive modes.

Figure 6:
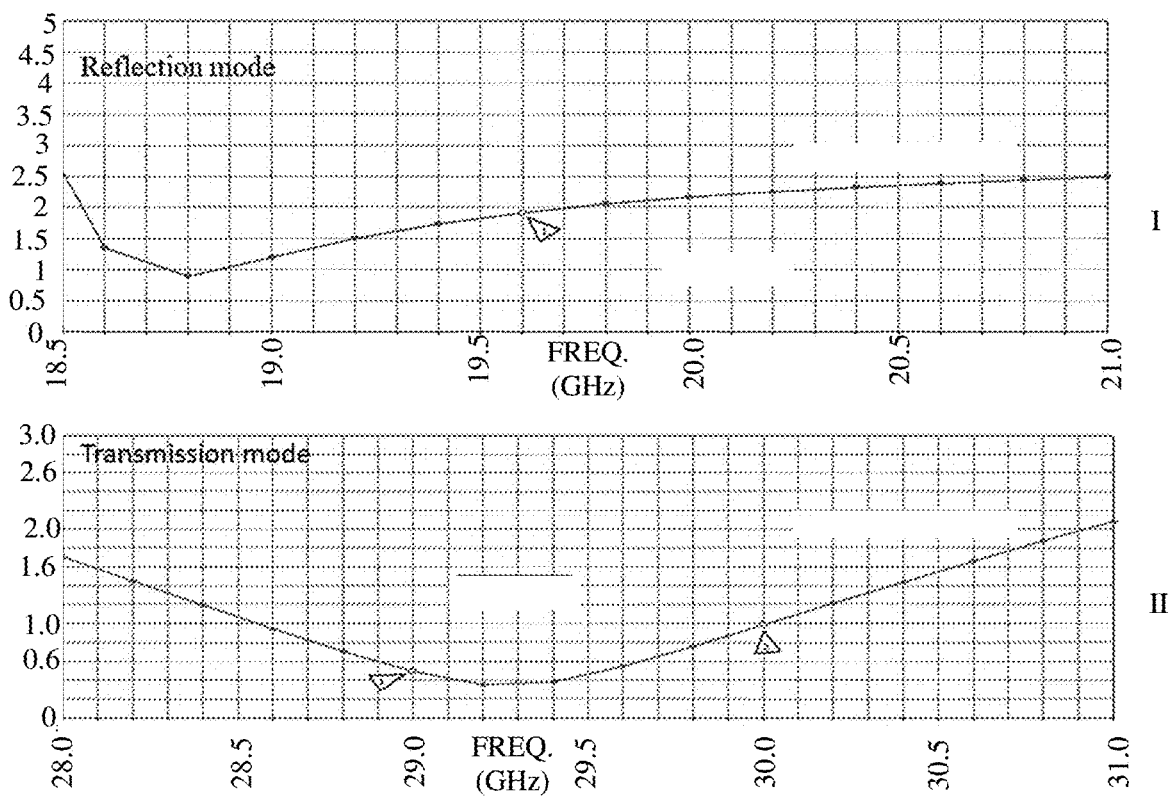
FIG. 6 is a graph that represents the axial ratio for the same reflected (I) and transmitted (II) signals presented in FIG. 5, according to some embodiments of the invention.

Reference is made also to FIG. 6, which represents the axial ratio for the same reflected (drawing I) and transmitted (drawing II) signals that are presented in FIG. 5, according to some embodiments of the invention. Drawing I of FIG. 6 is a graph presenting the gain of satellite communication system, such as communication system of FIGS. 2A and 2B, in reflection mode, as a function of the frequency. As depicted in graph I, from the point marked "1" (approximately 19.6 GHz) and up to 21 GHz the gain is substantially constant (varies between 2 dB and 2.5 dB). Drawing II of FIG. 6 is a graph presenting the gain of satellite communication system, such as communication system of FIGS. 2A and 2B, in transmission mode, as a function of the frequency. As depicted in graph II, between point marked "1" (approximately 29 GHz) and point marked "2" (approximately 30 GHz), the loss is substantially constant (varies between 0.5 dB and 1 dB).

Figure 7:
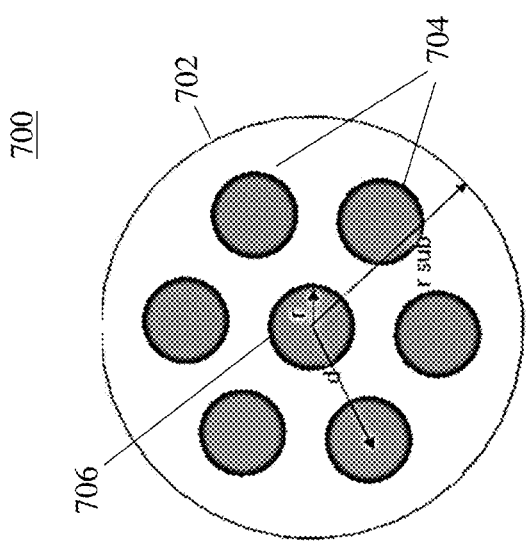
FIG. 7 presents a single beam feed by the combination of seven patch elements and their feed response.
Figure 7A:
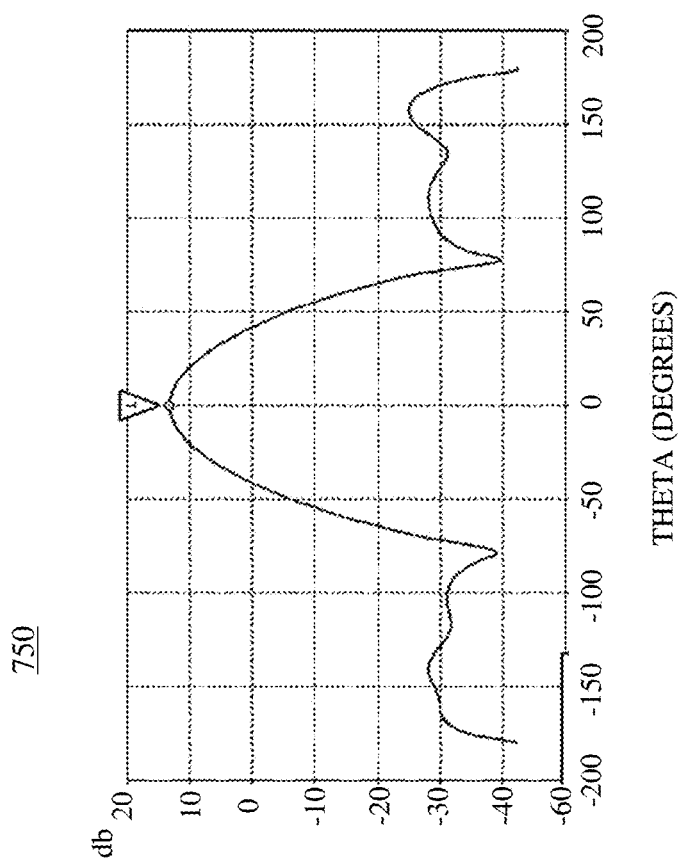
FIG. 7A depicts a graph showing a gain at the far field of a subnetwork, such as the subnetwork of FIG. 7, as a function of the offset angle, according to some embodiments of the present invention.
Figure 9:
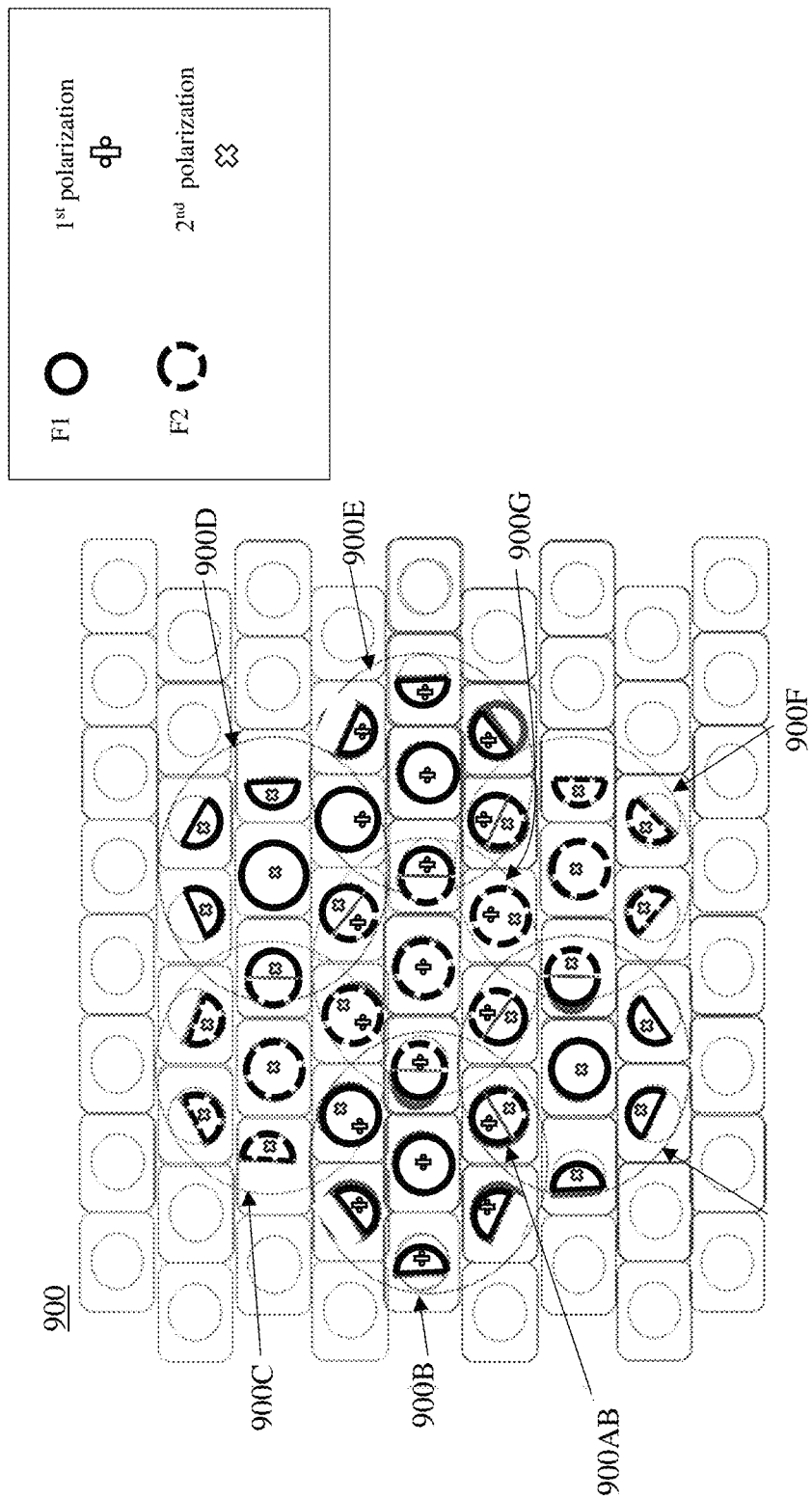
FIG. 9 represents an array of seven-beam configuration based on a reuse four with two frequency bands and two circular polarization, right and left, according to some embodiments of the present invention.

In some embodiments, a very compact multi beam feed for a multi beam antenna (MBA) is demonstrated, where the radiating unit includes multiple identical patch source elements. Elementary patch radiation sources may be grouped into identical subnetworks arranged around a central elementary patch source, where each subnetwork is intended and designed to form a single beam. Reference is made to FIGS. 7, 7A and 9, which depict an exemplary cross section of a patches subnetwork 700, a graph 750 showing a gain at the far field of a subnetwork, such as subnetwork 700, as a function of the offset angle [−180 to +180 degrees], and a schematic illustration of the arrangement 900 of adjacent beams of subnetworks, according to some embodiments of the invention. Subnetwork 700 may comprise a central radiating patch 706, and, in the example of FIG. 7, six radiating patches 704 may be positioned, evenly spaced, around central patch 706 on an imaginary circle having radius d. Patches 704 and 706 may be disposed on a round substrate 702. Each of patches 704, 706 may have radius r, which equals in this example to 1.85 mm, and the radius d may equal in this example to 5.4 mm Radius $r_{sub}$ of substrate 702 may be qual in this example to 9.05 mm. An array of subnetworks 900 may comprise plurality of subnetworks 900A, 900B . . . 900G arranged in a honeycomb structure demonstrated here by seven subnetworks, but that may be repeated as needed. Each two adjacent subnetworks 900A, 900B . . . 900G, may share at least one common basic patch element between them, e.g., basic element 900AB, which is shared by beam subnetworks 900A and 900B. The beam subnetworks may be packed, for example, in hexagonal shape such that every beam subnetwork shares at least one element with the six neighboring beam subnetworks. This packing arrangement allows achieving a very close adjacent beams and further allows achieving a contiguous coverage similar to cellular systems using only a single reflector. Each basic element source can be excited with either one or both, left and right hand, circular polarization and either or both first frequency F1 and second frequency F2. In FIG. 9, the different frequencies are symbolized by different lines of the outer circle, where F1 is depicted by a full line and F2 by a dashed line. The different circular polarizations are symbolized by the symbols ÷ for a first circular polarization and X for a second circular polarization. Attention may be given to the use of basic elements that are shared by two adjacent subnetworks (i.e., beams) for two different beams. The entire configuration allows building a contiguous coverage when adjacent beams cross each other on the 4 dB crossing line.

Reference is made now to FIG. 7A, which is a graph 750 demonstrating the gain of a single circular patch, such as basic element 900AB of FIG. 9, as measured in the far field away from the reflector, as a function of the offset angle of the transmission from the reflector main axis. As may be noticed the measured beam, at the central lobe, is relatively wide.

Figure 8:
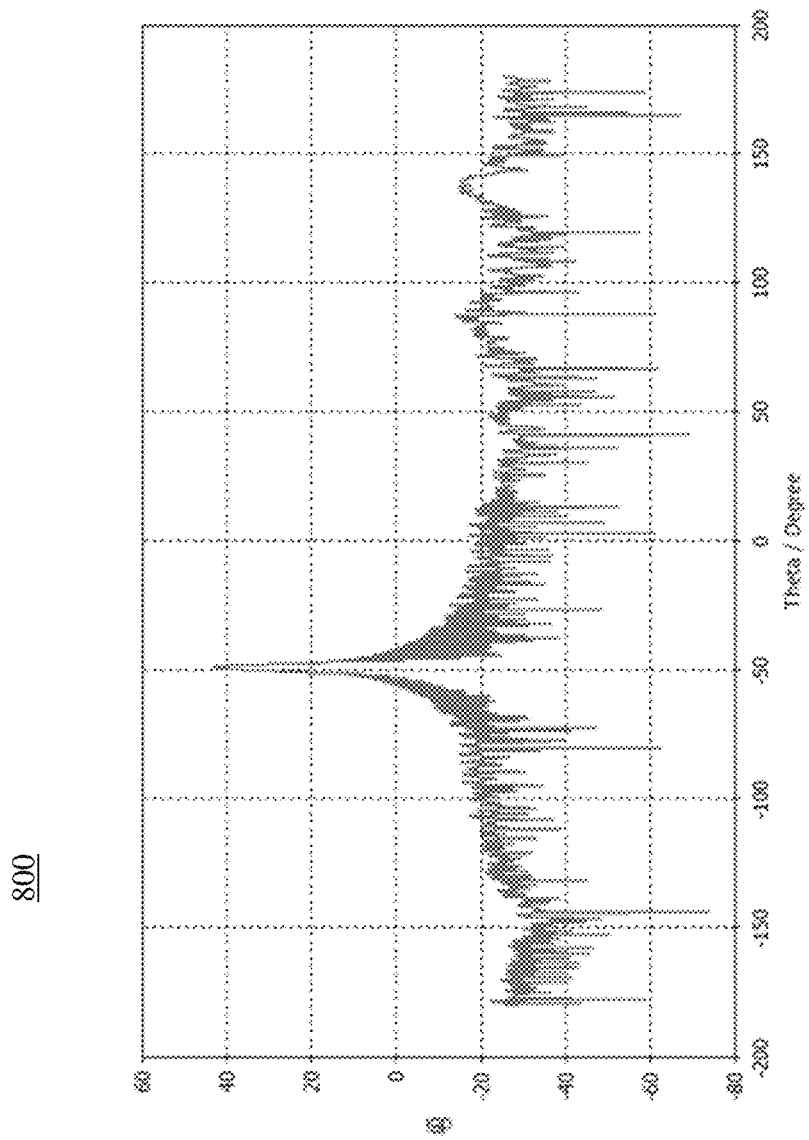
FIG. 8 presents response of a reflector and feed from previous figure, showing that the peak at −50 degrees is the 43 dB gain at 30 GHz.

Reference is made now also to FIG. 8, which is a graph 800 demonstrating the gain of a subnetwork, such as subnetwork 900A of FIG. 9, as measured in the far field away from the reflector, as a function of the of the offset angle of the transmission from the reflector main axis. As may be noticed, the central lobe (at offset angle −50 degrees) is very narrow, demonstrating the performance of a subnetwork beam, according to embodiments of the invention.

A special pattern is presented, e.g., in FIG. 9, which demonstrates that using the different polarization and different frequencies for each basic element enables implementation of the network combiner with high efficiency without losing efficiency due to the fact that the same element is used by two adjacent beams.

Figure 10:
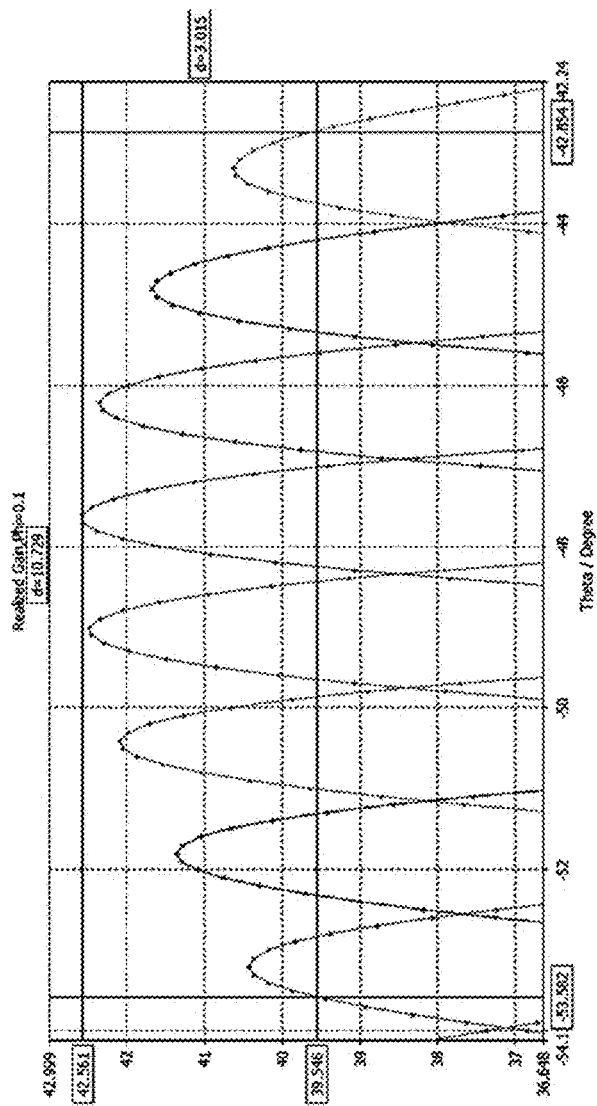
FIG. 10 is a graph of a typical response of a multi-beam unit in one of the directions along the multi-beam array, according to some embodiments of the present invention.

Reference is made to FIG. 10, which is a graph 1000 of a typical response of the multi beam in one of the directions on the multi beam array 900 of FIG. 9 (e.g., along a line extending between the central element of multi beam 900B to the central element of multi beam 900E). This graph shows the contiguous coverage with 4 dB level line (marked by a thick black line at the 39.456 dB level), which is crossing through adjacent beams. This large contiguous coverage is typically required also in similar applications. The planar combiner, which is schematically presented in FIG. 11, allows distribution of the RF transmission power to the central element of a beam array and to its surrounding elements, thereby achieving a desired amplitude function adapted to shape the antenna's response and to achieve the desired coverage (crossing of adjacent beams at 4 dB).

Figure 11:
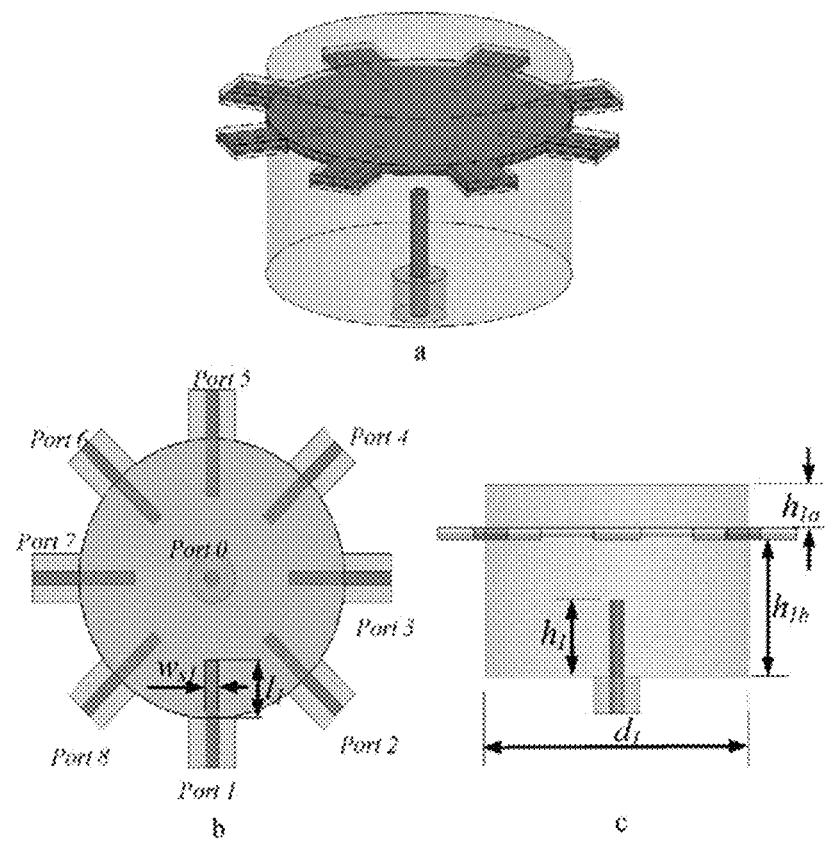
FIG. 11 is a schematic illustration of an 'eight-way combiner' usable in the communication system of the invention.

Reference is made to FIG. 11, which is a schematic illustration of an 'eight-way combiner' 1100 in side view, top view and isometric view. Eight-way combiner 1100 may be usable in a communication system of the invention. A tailor-made design of the combiner may enable compacting the combiner so that it occupies a very small area/volume/weight, which makes it very useful for miniaturized systems designed for launching to space as part of a communication satellite. Eight-way combiner 1100 may be fed at the port marked "a" and may feed up to eight output ports port 1 to port 8.

Figure 12:
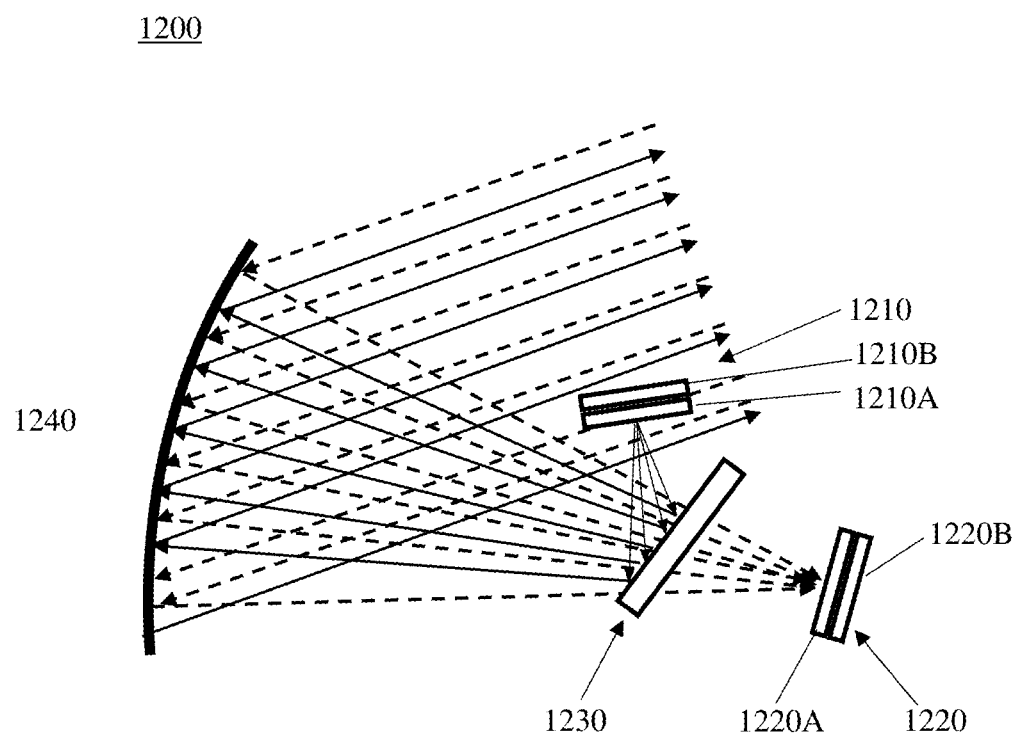
FIG. 12 is a schematic block diagram illustration of a satellite communication system implementing embodiments of the present invention according to some embodiments of the invention.

Reference is made to FIG. 12, which a schematic block diagram illustration of a satellite communication system 1200 implementing some embodiments of the present invention. Communication system 1200 may comprise a single reflector 1240, a CPFSS unit 1230—both similar, for example to corresponding elements in FIG. 2A. Communication system 1200 may further comprise Tx multi beam assembly 1210 and Rx multi beam assembly 1220. Tx multi beam assembly 1210 may comprise Tx multi beam unit 1210A which may be similar to corresponding element 104A in FIG. 2A and may further comprise Tx multi beam amplifier (MBA) unit 1210B. Rx multi beam assembly 1220 may comprise Rx multi beam unit 1220A which may be similar to corresponding element 104B in FIG. 2A and may further comprise Rx multi beam amplifier (MBA) unit 1220B. Each one of Tx multi beam amplifier (MBA) unit 1210B and Rx multi beam amplifier (MBA) unit 1220B may comprise IF amplifier unit, RF amplifier unit, power amplifier, such as solid state power amplifier (SSPA) and one-to-four, or one-to-seven RF switch unit, as described in detail with respect to FIG. 13. Each of Tx multi beam assembly 1210 and Rx multi beam assembly 1220 may be fed with up to four (or up to seven) different transmissions, all of which are powered by a single multi beam assembly. This way, a large number of beams may be serviced by a satellite employing satellite communication system 1200 with large reduction of weight and volume associated with the RF assemblies.

A proposed beam hopping process may be implemented with a switching matrix built by a basic one-to-seven (or one-to-four) switch enabling the taking advantage of reuse frequency pattern. Reuse pattern as used herein may refer to a method of allocating frequencies to adjacent beams while maintaining reduced level of interference.

Figure 13:
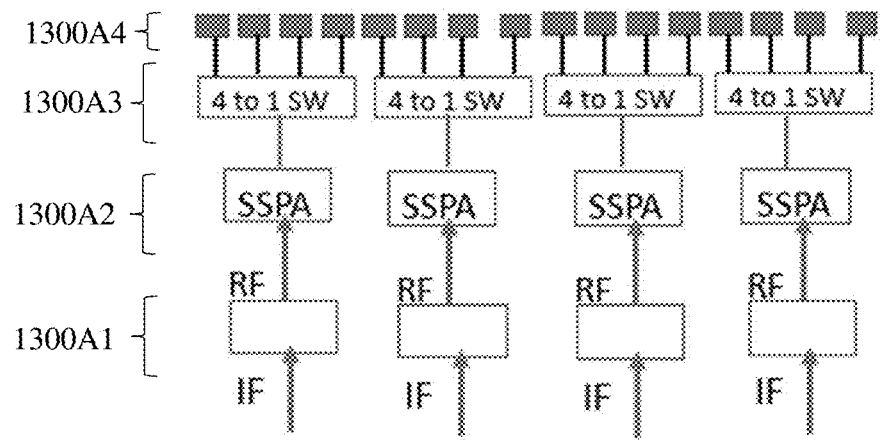
FIG. 13 is a schematic block diagram illustration of a switching assembly demonstrating two similar switching matrix assemblies that may be used in a satellite communication system, one for transmit and the other for receive, according to some embodiments of the invention.
Figure 13:
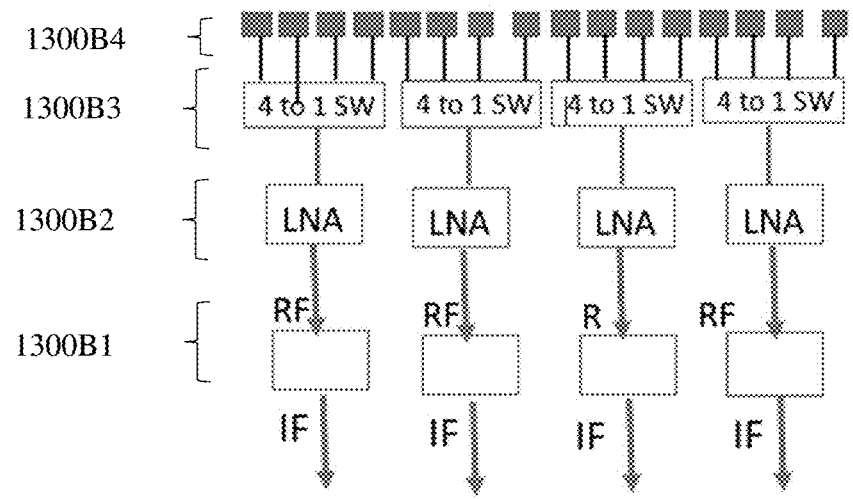

Reference is made to FIG. 13, which is a schematic block diagram illustration of a switching assembly 1300 demonstrating two similar switching matrix assemblies 1300A and 1300B that may be used—switching matrix assembly 1300A to transmit, and switching matrix assembly 1300B to receive, according to some embodiments of the invention. Each of matrix assemblies 1300A and 1300B may comprise, per each feed input, RF unit 1300A1/1300B1, power amplifier unit 1300A2/1300 B2, one-to-many switch unit 1300A3/1300B3 (one-to-four in the example of FIG. 13) and multiple (four in the example of FIG. 13) discrete RF feeds. The two switch assemblies are synchronized with each other.

A trade-off between size, weight and throughput (capacity) of a communication_satellite is achieved by employing a switching matrix that selects between multi spotbeam and a set of PA in the transmit path and LNA's in the receive path [see FIG. 13]. For example, a system can have 7K spot beams, with a one to seven switch, only one of the seven is served at a time. The K seven beams are synchronized in such a way that interference between beams is minimized. In this example, the capacity of each seven beams can use the full available frequency band.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A Circular Polarization Frequency Selective Surface (CPFSS) unit comprising:
    a plurality of CPFSS basic elements arranged in a planar arrangement of rows and columns, wherein each of the basic elements comprises:
        a rectangular substrate made of a dielectric material, wherein the substrate comprises a first symmetric line parallel to a first side of the substrate and a second symmetric line parallel to a second side of the substrate, wherein the first and second symmetric lines are orthogonal to each other;
        a first set of rectangular frames disposed on a first side of the substrate; and
        a second set of rectangular frames disposed on a second side of the substrate;
        wherein at least one frame of each of the first set of rectangular frames and at least one frame of the second set of rectangular frames are disposed one within the other, and both frames of each of the sets of frames are disposed symmetrically with respect to the first and the second symmetric lines; and
        wherein the frames of the first set and the frames of the second set are made of conductive thin material.

2. The CPFSS unit of claim one, wherein the substrate is a PCB substrate, and the first and second sets of frames are disposed on the first and second sides of the substrate, respectively, by a PCB production process.

3. A multi-beam transmit/receive device comprising:
    a Circular Polarization Frequency Selective Surface (CPFSS) unit according to claim 1;
    at least one transmit (Tx) flat array antenna assembly comprising multi-bean flat array antenna; and
    at least one receive (Rx) flat array antenna assembly comprising multi-bean flat array antenna;
    wherein the Tx multi-beam antenna is poisoned with respect to the CPFSS unit so that its transmission is configured to be reflected by the CPFSS unit to a reflector and to be reflected by the reflector in a defined direction; and
    wherein the Rx multi-beam antenna is positioned with respect to the CPFSS unit so that a transmission that hits the reflector from the defined direction and passes through the CPFSS unit focuses on the Rx multi-beam antenna.

4. The multi-beam transmit/receive device of claim 3 further comprising:
    a Tx multi beam amplifier (MBA) adapted to feed the Tx multi-bean flat array antenna with RF signals; and
    a Rx multi beam amplifier (MBA) adapted to amplify RF signals received by the Rx multi-bean flat array antenna.

5. The multi-beam transmit/receive device of claim 4, wherein:
    each of the Tx multi-bean flat array antenna and the Rx multi-bean flat array antenna comprises a plurality of circular arrays of subnetworks forming an antenna beam, wherein each of the subnetworks comprises:
        a central antenna element and six antenna elements evenly spaced and disposed around the central element in a constant distance from the central element;
    wherein the plurality of circular arrays of subnetworks are arranged in a hexagonal arrangement in which every two neighboring subnetworks share one antenna element with one another.

6. The multi-beam transmit/receive device of claim 5, wherein each of the basic antenna elements may be excited by a single frequency and single polarization, or by a single frequency and two polarizations, or by two frequencies and a single polarization, or by two frequencies and two polarizations.

7. The multi-beam transmit/receive device of claim 5, wherein:
    the Tx flat array antenna assembly further comprises a Tx multi beam amplifier (MBA) unit; and
    the Rx flat array antenna assembly further comprises a Rx multi beam amplifier (MBA) unit.

8. The multi-beam transmit/receive device of claim 7, wherein:
    the Tx MBA unit comprises, for each beam of the Tx multi-beam antenna:
        an intermediate frequency (IF) amplifier;
        a solid-state power amplifier (SSPA); and
        one-to many switch unit adapted to direct signal provided to it to a selected beam element of the multiple beam elements of the beams; and
    the Rx MBA unit comprises, for each beam of the Rx multi-beam antenna:
        an intermediate frequency (IF) amplifier;
        a solid-state power amplifier (SSPA); and
        one-to many switch unit adapted to direct signal received by a selected beam element of the multiple beam elements of the beams to the SSPA.

9. The multi-beam transmit/receive device of claim 3 wherein the CPFSS unit, the at least one Tx flat array antenna assembly and the at least one Rx flat array antenna assembly are tiltable between a stowed position and a deployed position.

10. The multi-beam transmit/receive device of claim 9 wherein in the deployed position the CPFSS unit, the at least one Tx flat array antenna assembly and the at least one Rx flat array antenna assembly are positioned with respect to each other so that:
- the transmission of the Tx flat array antenna assembly is configured to be reflected by the CPFSS unit to a reflector and to be reflected by the reflector in a defined direction; and
- a transmission that hits the reflector from the defined direction and passes through the CPFSS unit focuses on the Rx multi-beam antenna.

* * * * *